United States Patent [19]

Jaffe et al.

[11] 4,293,837
[45] Oct. 6, 1981

[54] HALL EFFECT POTENTIOMETER

[75] Inventors: Wolfgang Jaffe, Roselle Park; Bruce R. Rogan, Somerville, both of N.J.

[73] Assignee: The Singer Company, Stamford, Conn.

[21] Appl. No.: 171,512

[22] Filed: Jul. 23, 1980

[51] Int. Cl.³ .......................................... H01L 43/04
[52] U.S. Cl. .................................. 338/32 H; 323/368
[58] Field of Search ......................... 338/32 H, 32 R; 323/352, 353, 354, 368; 324/251, 252

[56] References Cited

U.S. PATENT DOCUMENTS

| | | | |
|---|---|---|---|
| 2,989,715 | 6/1961 | Welker et al. | 338/32 R |
| 3,112,464 | 11/1963 | Ratajski et al. | 338/32 H |
| 3,147,426 | 9/1964 | Metzger | 323/368 |
| 3,286,161 | 11/1966 | Jones | 323/368 X |
| 3,359,522 | 12/1967 | Albrecht et al. | 338/32 R |
| 3,366,908 | 1/1968 | Weiss et al. | 338/32 R |
| 3,648,155 | 3/1972 | Soehner et al. | 338/32 R X |
| 3,671,854 | 6/1972 | Masuda | 338/32 H |
| 3,691,502 | 9/1972 | Kataoka | 338/32 R |
| 3,777,273 | 12/1973 | Baba et al. | 338/32 H X |
| 3,988,710 | 10/1976 | Sidor et al. | 338/32 R |
| 4,066,962 | 1/1978 | Jaffe | 338/32 H X |
| 4,132,970 | 1/1979 | Masuda et al. | 338/32 R |

Primary Examiner—C. L. Albritt
Attorney, Agent, or Firm—William V. Ebs; Robert E. Smith; Edward L. Bell

[57] ABSTRACT

A Hall effect sensor is disposed between two magnets having their fields in quadrature and in association with a movable specially formed ferromagnetic part which is used to control flux in the sensor in such a way as to cause the sensor to produce a linearly varying output voltage dependent upon the position of the part.

8 Claims, 8 Drawing Figures

4,293,837

HALL EFFECT POTENTIOMETER

DESCRIPTION

Background of the Invention

1. Field of the Invention

The invention relates to potentiometers, and more particularly to potentiometers of the contactless type.

2. Description of the Prior Art

There are a number of disadvantages to the use in control systems of the conventional type potentiometer including a wiper arm which must be moved along a resistance element to produce a desired output voltage. A principal disadvantage is the tendency of the resistance element after a short period of time to wear to the point where the device ceases to function reliably, and contactless potentiometers of various designs have been developed to overcome this difficulty. However these contactless designs have presented other problems. In general such designs if not complex and costly to produce display undesirable operating characteristics.

It is a prime object of the present invention to provide a contactless potentiometer which is simple in construction, which can be easily and economically produced from readily available components, and which will consistently provide an output voltage varying linearly in a defined manner according to the positioning of an input control member.

It is another object of the invention to provide a contactless potentiometer design which can be readily embodied in different forms and which can be produced as a device having a rotary manual input control or as a device with a linearly translatable manual input control.

Other objects and advantages of the invention will become apparent during a reading of the specification taken in connection with the accompanying drawings.

SUMMARY OF THE INVENTION

The potentiometer of the invention includes a solid state Hall effect sensor which is disposed between a pair of magnets having their fields in quadrature and flux from the magnets at least partially cancelling the Hall element of the sensor. The magnets and Hall effect sensor are affixed in a structure which supports a movable member composed of a ferromagnetic material or at least including a ferromagnetic element. The ferromagnetic part can be moved toward the Hall effect sensor to increase the net flux in the Hall element and thereby the voltage output of the sensor, and can be moved away from the Hall effect sensor to decrease the net flux in the Hall element as well as the voltage output of the sensor. The ferromagnetic part is so configured, and the movement thereof in response to the operation of an input control member is such as to cause the sensor to produce an output voltage which varies linearly in a defined manner according to the position of the input member.

DESCRIPTION OF THE PREFERRED EMBODIMENTS OF THE INVENTION

Figure 1:
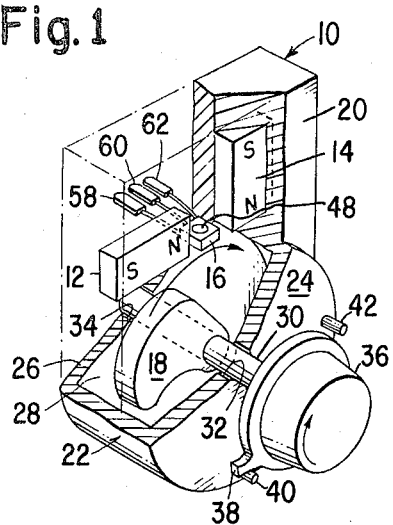
FIG. 1 is a somewhat schematic perspective view of a contactless potentiometer according to the invention.

Referring to FIGS. 1, 2, 3 and 4 of the drawings, reference character 10 designates a potentiometer including a pair of permanent magnets 12 and 14, a Hall effect sensor 16 and a movable member 18 of a ferromagnetic material. As shown, the magnets and sensor are embedded in a rectangularly shaped extended portion 20 of a plastic housing structure 22 having end walls 24 and 26 which define a cavity 28 wherein member 18 is affixed to a shaft 30. The shaft 30 is rotatably supported in the end walls at 32 and 34 and can be turned by a control knob 36 to position the member 18 relative to the Hall effect sensor and permanent magnets within limits defined by a tab 38 on the knob and stops 40 and 42 on the housing end wall 24.

The magnets 12 and 14 are located in structure 22 with their magnetic fields in quadrature, and the Hall effect sensor 16 is located between the magnets in a position wherein flux lines 44 from magnet 12 and flux lines 46 from magnet 14 pass in opposite directions through the broad plane of a Hall element 48 (Hall generator). The sensor 16 is a linear output Hall effect sensor which may be conventional in design and as such include the Hall element 48 in association with a linear amplifier and an output transistor on a single silicon chip. As shown, the sensor is disposed with chip surfaces 50 and 52 parallel to the axis 54 of the magnetic field of magnet 12, and perpendicular to the axis 56 of the magnetic field of magnet 14. Input, ground and output terminals 58, 60 and 62 respectively connect with the sensor to supply a constant input voltage and provide an output signal control voltage according to the flux density in the Hall element.

Figure 2:
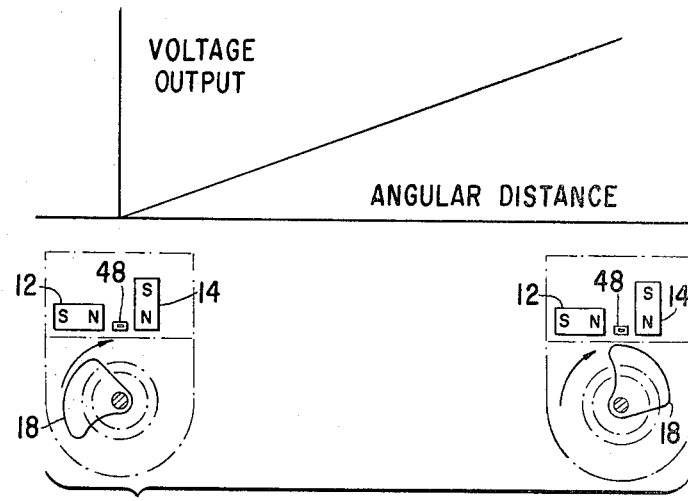
FIG. 2 is a graphical representation which relates the output voltage of the potentiometer of FIG. 1 to the position of a movable ferromagnetic part within the device.
Figure 4:
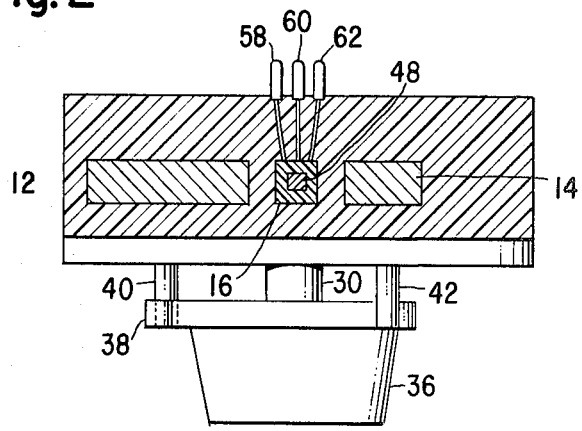
FIG. 4 is a sectional view taken on the plane of the line 4—4 of FIG. 3.
Figure 3:
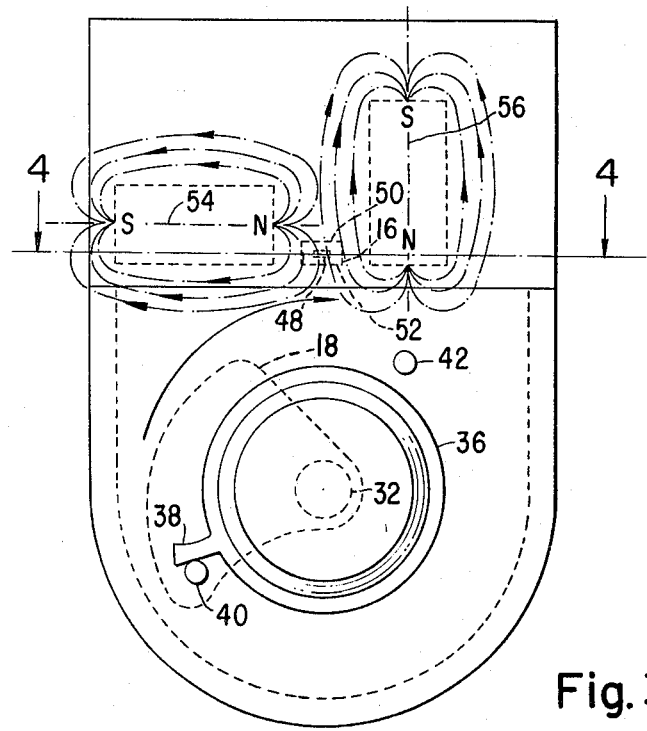
FIG. 3 is a front elevational view of the potentiometer of FIG. 1 showing flux lines.

Flux tends to cancel in Hall element 48 because the magnetic fields of magnets 12 and 14 extend in different directions, and such magnets are selected as well as positioned with regard to their relative strengths to effect substantially zero net flux in the Hall element in a position of knob 36 with tab 38 against stop 40. In the position of knob 36 with tab 38 against stop 40 the bulk of the mass of member 18, which is a sector-like part is far removed from the Hall element 48 and exerts substantially no effect on the net flux in the element. However, as knob 36 is moved in a direction to disengage tab 38 from stop 40, more of the mass of member 18 is brought into line with the Hall element to increase net flux in element 48, and thereby the output voltage of sensor 16 as reflected at output terminals 60 and 62. Member 18 is purposely asymmetrically shaped in such manner as to predetermine a linearly varying voltage output for the Hall effect sensor 16 depending upon the position of member 18 as shown in FIG. 2, with a minimum value in the position of control knob 36 where tab 38 engages stop 40, and a maximum value in the position of the control knob where tab 38 engages stop 42.

Figure 5:
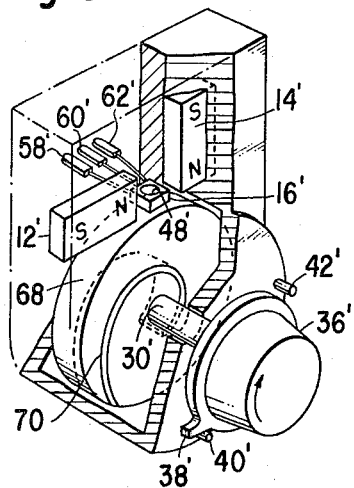
FIG. 5 is a view similar to FIG. 1 showing a modified construction for the potentiometer.
Figure 6:
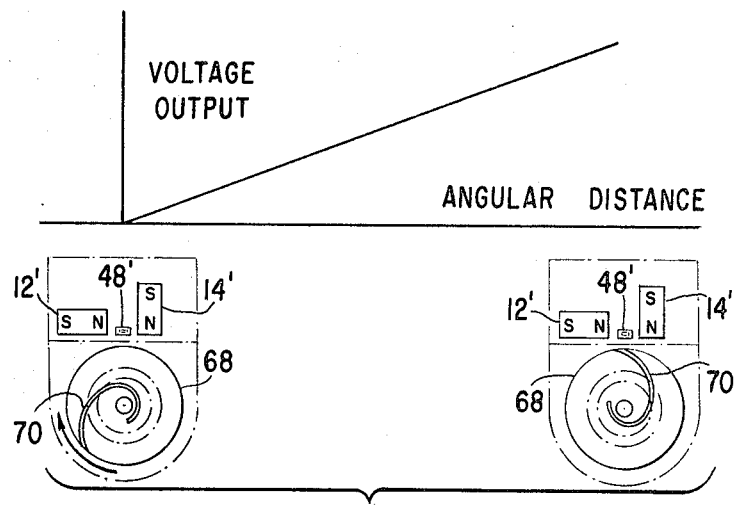
FIG. 6 is a graphical representation relating the output voltage of the potentiometer of FIG. 5 to the position of a movable ferromagnetic part thereof.

A modified form of potentiometer according to the invention is shown in FIGS. 5 and 6 wherein parts corresponding to those shown in FIGS. 1, 2, 3 and 4 are designated by like reference characters with a prime mark (') added thereto. Such modified potentiometer includes a circular wheel like member 68 which is affixed to a shaft 30' turnable by a knob 36' between a position where a tab 38' engages a stop 40' on the device and a position where the tab engages a stop 42'. Member 68 is of a non-magnetizable material which is preferably plastic, and has an asymmetrically shaped strip 70 of ferromagnetic material embedded therin. The strip follows a generally helical outline as shown. In the position of knob 36' wherein tab 38' engages stop 40' the strip is everywhere removed from close association with a Hall element 48' of a sensor 16' located between magnets 12' and 14'. As the control knob is turned to move tab 38' away from stop 40' and toward stop 42', the strip 70 is moved into closer association with the sensor 16' under the Hall effect element 48', and the output voltage across terminals 60' and 62' increases as indicated in FIG. 6.

Figure 7:
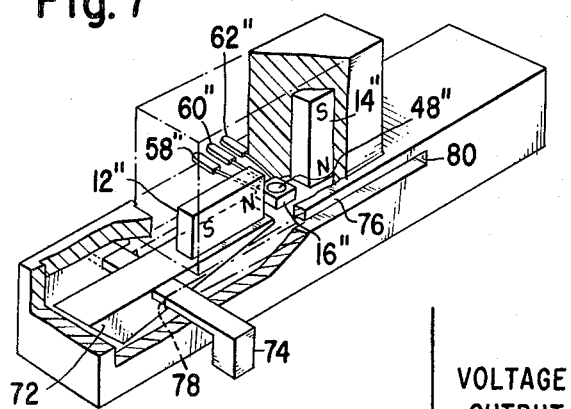
FIG. 7 is a view similar to FIGS. 1 and 5 showing another modified construction for the potentiometer.
Figure 8:
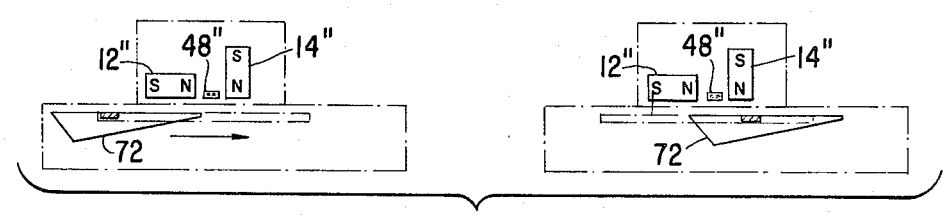
FIG. 8 is a graphical representation similar to FIGS. 2 and 6 relating the output voltage of the potentiometer of FIG. 7 to the position of a movable ferromagnetic part in the device.

In FIGS. 7 and 8 showing still another modified form of potentiometer according to the invention, parts corresponding to those shown in FIGS. 1 through 4 are designated by like reference characters with a double prime mark (") added thereto. Such modified potentiometer includes a wedge-shaped member 72 of ferromagnetic material which is linearly movable by a control member 74 that is affixed to the member 72 and extends through a slot 76 in the device. Wedge-shaped member 72 is movable between a position wherein the control member 74 engages one end 78 of the slot and a position wherein the control member 74 engages the other end 80 of the slot. As the control member 74 is moved between a position of engagement with slot end 78 to a position of engagement with slot end 80, the asymmetrically shaped ferromagnetic member 72 is moved from a location where the bulk of its mass is most distant from a Hall element 48" in a sensor 16" which is between magnets 12" and 14" to a location where the bulk of the mass is closest to the Hall element. Flux in the Hall element is increased and the output voltage across terminals 60" and 62" increases in the manner shown in FIG. 6.

While the present disclosure relates to preferred embodiments of the invention it is for purposes of illustration only, and is not to be construed as a limitation of the invention. Numerous alterations and modifications of the structure herein disclosed will suggest themselves to those skilled in the art, and all such modifications and alterations which do not depart from the spirit and scope of the invention are intended to be included within the scope of the appended claims.

I claim:

1. A potentiometer comprising a pair of magnets having their fields in quadrature, and a solid state Hall effect sensor with input and output terminals connected thereto, the magnets and sensor being located in a fixed spatial relationship with the sensor between the magnets and the magnets having their axes mutually perpendicular but parallel and perpendicular respectively with respect to the broad plane of the sensor in positions wherein flux from the magnets at least partially cancels in the sensor, said potentiometer further including a ferromagnetic member movable in a defined manner relative to the sensor and flux from the magnet, the ferromagnetic member having a predetermined asymmetrical shape resulting in a linearly varying voltage across said output leads throughout a range of movement of the ferromagnetic member while a constant voltage is applied to the input terminals.

2. The combination of claim 1 wherein the ferromagnetic member is rotatable about an axis having a fixed position relative to the magnets and sensor.

3. The combination of claim 2 wherein said member is a rotatable sector-like part.

4. The combination of claim 1 wherein the ferromagnetic member is movable in a direction parallel to the plane of the sensor.

5. The combination of claim 4 wherein the ferromagnetic member is generally wedge-shaped.

6. The combination of claim 5 wherein said member includes a planar surface parallel to the plane of the sensor and an opposite surface which is inclined relative to said parallel planar surface.

7. The combination of claim 1 including a generally circular member wherein the ferromagnetic member is embedded, the circular member being rotatable about an axis having a fixed position relative to the magnets and sensor.

8. The combination of claim 7 wherein the circular member is plastic.

* * * * *